(12) United States Patent
Wolf

(10) Patent No.: US 8,947,096 B1
(45) Date of Patent: Feb. 3, 2015

(54) TRAILER LIGHT TESTER

(76) Inventor: Paul Wolf, Mandan, ND (US)

( * ) Notice: Subject to any disclaimer, the term of this patent is extended or adjusted under 35 U.S.C. 154(b) by 57 days.

(21) Appl. No.: 12/798,768

(22) Filed: Apr. 12, 2010

Related U.S. Application Data

(60) Provisional application No. 61/212,344, filed on Apr. 10, 2009.

(51) Int. Cl.
*G01R 31/00* (2006.01)
*B60Q 11/00* (2006.01)
*G01R 31/44* (2006.01)

(52) U.S. Cl.
CPC .............. *B60Q 11/00* (2013.01); *B60Q 11/007* (2013.01); *G01R 31/006* (2013.01); *G01R 31/44* (2013.01)
USPC ........... 324/414; 324/500; 324/504; 324/555; 324/556; 340/431

(58) Field of Classification Search
CPC .... G01R 31/006; G01R 31/44; G01R 31/026; G01R 31/245; H05B 37/03; H05B 37/036; B60Q 1/305; B60Q 11/007; B60D 1/36; B60D 1/38; G01L 5/28; H01K 3/305
USPC ........... 324/414, 500, 504, 555–556; 340/431
See application file for complete search history.

(56) References Cited

U.S. PATENT DOCUMENTS

| | | | | |
|---|---|---|---|---|
| 4,884,032 | A * | 11/1989 | LaPensee | 324/504 |
| 5,095,276 | A | 3/1992 | Nepil | |
| 5,416,421 | A | 5/1995 | Doland, Sr. et al. | |
| 5,604,439 | A | 2/1997 | Walkington et al. | |
| 5,990,788 | A * | 11/1999 | Syracuse | 340/458 |
| 6,043,661 | A * | 3/2000 | Gutierrez | 324/504 |
| 6,172,508 | B1 | 1/2001 | Nutt | |
| 7,336,082 | B1 * | 2/2008 | Mofield | 324/504 |
| 7,339,465 | B1 * | 3/2008 | Cheng et al. | 340/514 |
| 7,345,579 | B2 * | 3/2008 | Nelson et al. | 340/431 |
| 8,378,690 | B1 | 2/2013 | Jiles | |
| 8,816,691 | B2 * | 8/2014 | Miller et al. | 324/414 |
| 8,816,697 | B2 * | 8/2014 | Miller et al. | 324/538 |

(Continued)

OTHER PUBLICATIONS

"TH880A—Remote Control Automatic Cycel Semi-Tractor/Trailer Light Circuit Tester/Processor", RBE Electronics, Inc., Copyright 2000-2005.*

*Primary Examiner* — Patrick Assouad
*Assistant Examiner* — Sean Curtis

(57) ABSTRACT

A new portable, self-contained device for testing the full cycle of trailer light modes without additional manual actuation by the user and for identifying where and what type of specific error occurred, if any are detected. The inventive device generally comprises a compact portable housing with a fixedly attached handle and a removable housing top. Within the compact portable housing is a self-contained, rechargeable 12 volt power source to power all functionality over a sustained period of time. Also within the compact portable housing is a light mode control means that allows the device to cycle through multiple light modes for testing, and an error detection analysis means that indicates where and what type of fault is detected. The outside surface of the compact portable housing contains an on/off switch means, a light mode selector switch to select from individual light modes or a cycle mode that rotates through all light modes at a predetermined interval, and fault detection indicators to indicate when, where, and what type of fault has been detected. Attached to a side of the housing is a connection port for connecting the device to a trailer light wiring harness.

18 Claims, 3 Drawing Sheets

(56) References Cited

U.S. PATENT DOCUMENTS

| | | | |
|---|---|---|---|
| 2004/0008462 A1* | 1/2004 | Kluth et al. | 361/90 |
| 2006/0041417 A1* | 2/2006 | Palladino | 703/14 |
| 2007/0120570 A1* | 5/2007 | Nelson et al. | 324/504 |
| 2008/0018303 A1* | 1/2008 | Scheucher | 320/128 |
| 2008/0042656 A1* | 2/2008 | Hall | 324/500 |
| 2008/0231285 A1* | 9/2008 | Curtis | 324/504 |
| 2008/0238639 A1* | 10/2008 | Hopkins | 340/431 |
| 2008/0265904 A1 | 10/2008 | Biel | |
| 2009/0212784 A1 | 8/2009 | Killian et al. | |
| 2012/0146653 A1* | 6/2012 | Rybolt | 324/504 |

* cited by examiner

TRAILER LIGHT TESTER

BACKGROUND OF THE INVENTION

1. Field of the Invention

The present invention relates generally to a device for testing the function of trailer lights and more specifically it relates to a self-contained, portable trailer light tester for testing tow trailer lights without the need for a tow vehicle.

2. Description of Related Art

Tow trailer lights are prone to frequent failure. In general, trailer lights are exposed to the elements, and boat trailer lights specifically are repeatedly submerged in water. The wires are exposed and subject to damage and the connectors are prone to corrosion. Trailers, with their smaller wheels and limited suspension, subject the filaments in the trailer light bulbs to a significant amount of jarring, causing the bulbs to fail frequently. Improperly working trailer bulbs are both a legal and a safety issue, therefore trailer lights must be tested often.

The main problems with the existing methods for testing trailer lights is that they require a tow vehicle to be connected to the trailer and require a second person to test all possible light modes. Currently, testing trailer lights requires a towing vehicle to be placed near the trailer and connected to the trailer wiring. A person inside the vehicle operates the different light modes—left turn signal, right turn signal, brake lights, clearance lights—while a second person checks the functioning of the lights. It is also possible for a single person to check the signal and clearance lights by initiating the different light modes in the tow vehicle and then walking to the back of the trailer to observe and check the light function. Both methods are inconvenient and time consuming.

Devices designed to test trailer lights without a tow vehicle exhibit a number of problems. Large, commercial designs for use on over-the-road tractor trailers are too costly and cumbersome for lighter duty trailer applications. Also, the connection interface on these devices is different and not readily adapted for use on personal and light commercial tow trailers. Other designs do not have the ability to automatically switch between light modes, nor indicate when and where a fault has been detected. These designs also require the user to carry the device around the back of the trailer while tethered via a long multi-conductor cable to the plug on the front of the trailer.

This invention provides a fast, effective and convenient way to test all of the light modes of tow trailer lights without the need for a tow vehicle or a second person, thus promoting safety and legality for any trailer used for recreational or light commercial activities. The present invention substantially departs from the concepts and designs of the prior art and in doing so provides an apparatus primarily developed for testing the full cycle of tow trailer light modes without additional interaction by the user, without the need to carry the device during testing and for identifying where the specific failure occurred, if any are detected.

SUMMARY OF THE INVENTION

In view of the foregoing disadvantages inherent in the known types of trailer light testers now present in the prior art, the current invention provides a new portable, self-contained device for testing the full cycle of trailer light modes without additional manual actuation by the user, and for identifying where and what type of specific error occurred, if any are detected.

The general purpose of the present invention, which will be described subsequently in greater detail, is to provide a new self-contained, portable trailer light tester that has many of the advantages of the trailer light tester mentioned heretofore and many novel features that result in a new self-contained, portable trailer light tester which is not anticipated, rendered obvious, suggested, or even implied by any of the prior art trailer light testers, either alone or in any combination thereof.

To attain this, the present invention generally comprises a compact portable housing with a fixedly attached handle and a fixedly or hingedly attached housing top. Within the compact portable housing is a self-contained, rechargeable 12 volt power source to power all functionality over a sustained period of time. Also within the compact portable housing is a light mode control means that allows the device to cycle through multiple light modes for testing, and an error detection analysis means that indicates where and what type of fault is detected. The compact portable housing also contains a resettable power interrupter to protect the microprocessors or programmable logic circuits from power surges or shorts. The outside surface of the compact portable housing contains an on/off switch means, a power interrupter reset switch, and a light mode selector switch to select from four individual light modes or a cycle mode that rotates through all light modes at a predetermined interval. The outside surface of the compact portable housing also has error detection indicators to indicate when, where, and what type of fault has been detected. The one side of the compact portable housing contains a fixedly attached connection means compatible either directly with the trailer wiring interface or through the use of a removably attached optional connection adaptor. The side of the compact portable housing also contains a power source recharge means.

There has thus been outlined, rather broadly, the more important features of the invention in order that the detailed description thereof may be better understood, and in order that the present contribution to the art may be better appreciated. There are additional features of the invention that will be described hereinafter.

In this respect, before explaining at least one embodiment of the invention in detail, it is to be understood that the invention is not limited in its application to the details of construction and to the arrangements of the components set forth in the following, description or illustrated in the drawings. The invention is capable of other embodiments and of being practiced and carried out in various ways. Also, it is to be understood that the phraseology and terminology employed herein are for the purpose of the description and should not be regarded as limiting.

A primary object of the present invention is to provide a self-contained, portable trailer light tester that does not require the use of a tow vehicle and that will overcome the shortcomings of the prior art devices.

An object is to provide a self-contained, portable trailer light tester with an on-board, rechargeable power source with enough capacity to test multiple consecutive sets of trailer lights between charges. Further, this self-contained system is a portable system capable of being carried in one hand.

Another object is to provide a self-contained, portable trailer light tester with integrated diagnostics capable of detecting errors, indicating between types of errors, and specifying the light mode where the error occurred through the use of microcontrollers or programmable logic circuits.

Another object is to provide a self-contained, portable trailer light tester capable of testing a single light mode or cycling through multiple light modes automatically.

Another object is to provide a self-contained, portable trailer light tester with a connection means capable of attaching to recreational vehicles or universal tow trailer adapters.

Another object is to provide a self-contained, portable trailer light tester with a resettable power interrupter to protect the microcontrollers or programmable logic circuits from surges or shorts.

Another object is to provide a self-contained, portable trailer light tester with socket means for testing common trailer bulb configurations.

Another object is to provide a self-contained, portable trailer light tester with a compartment for onboard tool and parts storage.

Another object is to provide a self-contained, portable trailer light tester with a wireless hand-held remote control for changing operations on the device without the need to be physically present at the device.

Another object is to provide a self-contained, portable trailer light tester capable of testing the functionality of electric trailer braking systems.

Another object is to provide a self-contained, portable trailer light tester capable of testing the functionality of reverse indicator lights.

Other objects and advantages of the present invention will become obvious to the reader and it is intended that these objects and advantages are within the scope of the present invention.

To the accomplishment of the above and related objects, this invention may be embodied in the form illustrated in the accompanying drawings, attention being called to the fact, however, that the drawings are illustrative only, and that changes may be made in the specific construction illustrated.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE INVENTION

The present invention and the various features and advantageous details thereof are explained more fully with reference to the non-limiting embodiments described in the following description.

The device is comprised of a compact portable housing 10 of sufficient size to house and support all of the components and functions related to the invention and subsequently described. The compact portable housing 10 is comprised of any number of materials specifically suited to its function. The housing 10 is generally rectilinear shaped having four vertical sidewalls and a horizontal floor. The top side 14 of the housing 10 contains a fixedly attached handle 12 of a size and dimension suitable to be grasped by a commonly sized human hand. The handle 12 is used to relocate the housing 10 and enables the convenient portability of the device. The removably attached housing top side 14 provides access to the internal components of the device should maintenance or replacement of those components become necessary.

Figure 1:
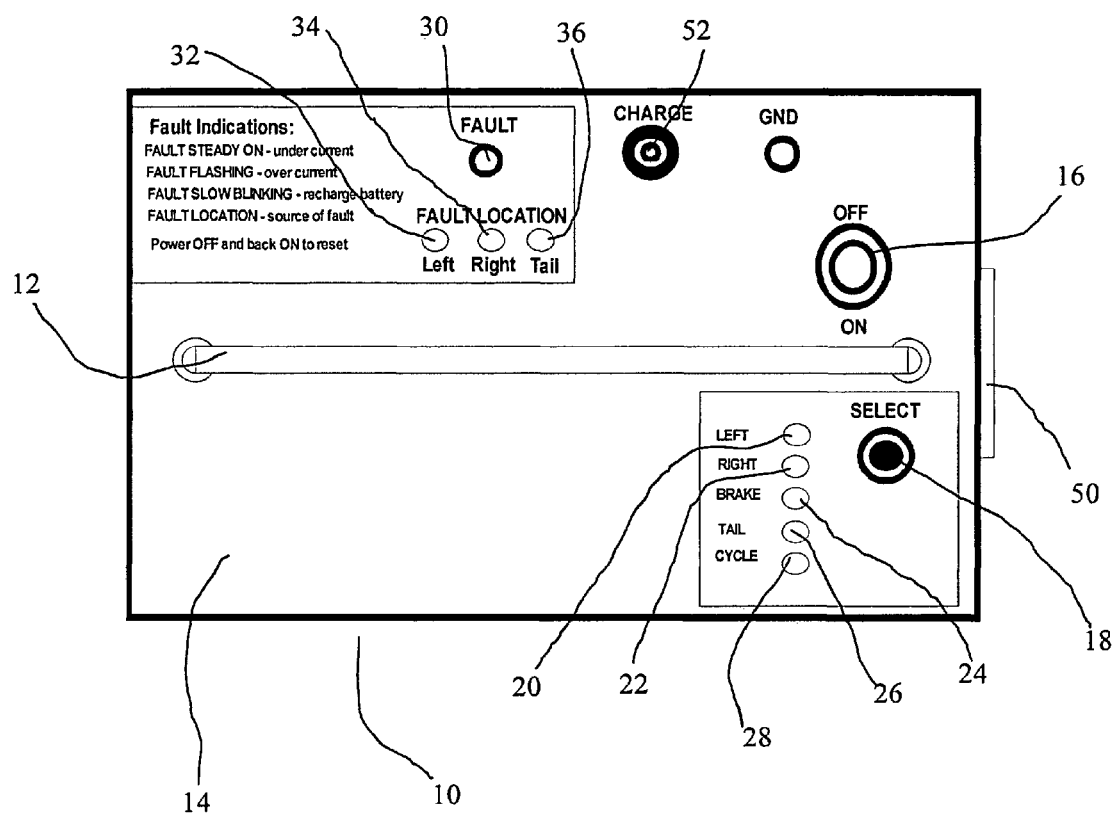
FIG. 1 is a top perspective view of the device according to an embodiment of the invention.
Figure 2:
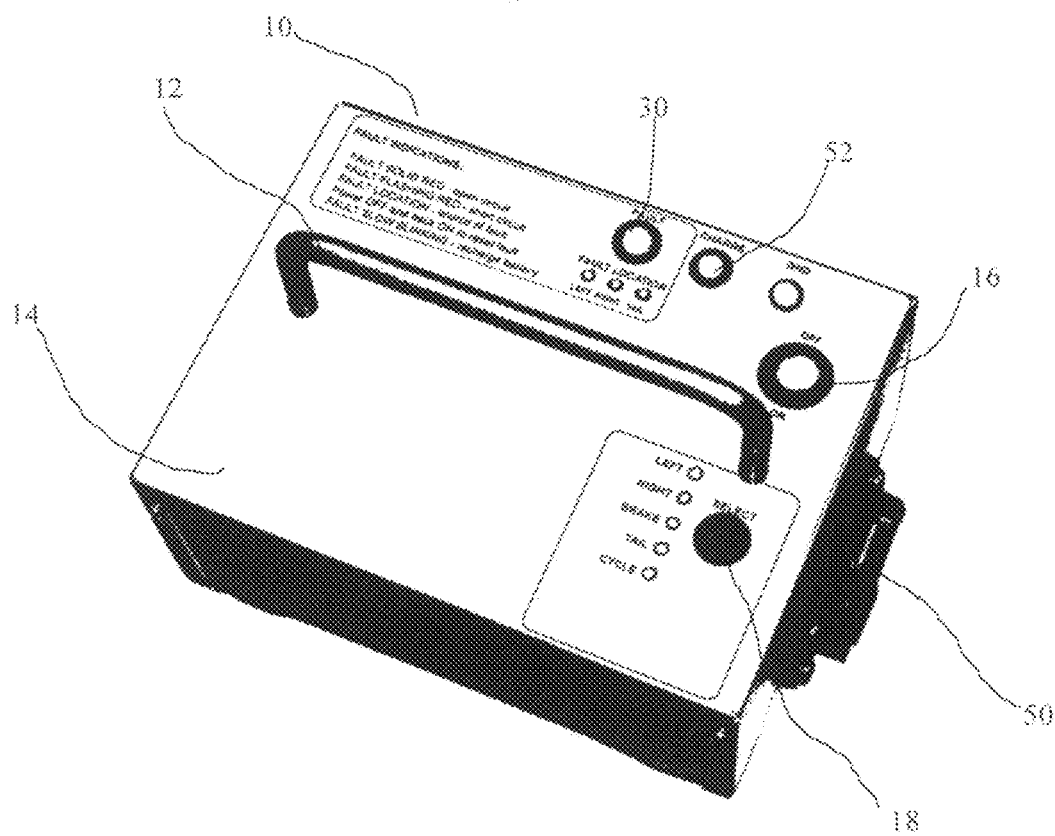
FIG. 2 is an isometric side view of the device shown in FIG. 1.

On the housing top side 14 are a plurality of switches and lights. Referring to FIGS. 1 and 2, the switches include an on/off switch means 16 for connecting or disconnecting the power source 38 from the rest of the device. The top side further contains a light mode selector button 18 which is manually actuated to select from four individual light modes; left turn signal 20, right turn signal 22, brake lights 24 and tail lights 26. The light mode selector button 18 may also be actuated to select a cycle mode 28 that rotates through the turn signals, brake lights and tail lights at a predetermined time interval. The top side 14 also contains a main fault indicator light 30 and location fault indicator lights for the left side 32, the right side 34 and the tail lights 36. The main fault indicator light 30 informs the user of the type of fault encountered while the location fault indicator lights 32, 34, 36 identify the location of the recognized fault.

Figure 3:
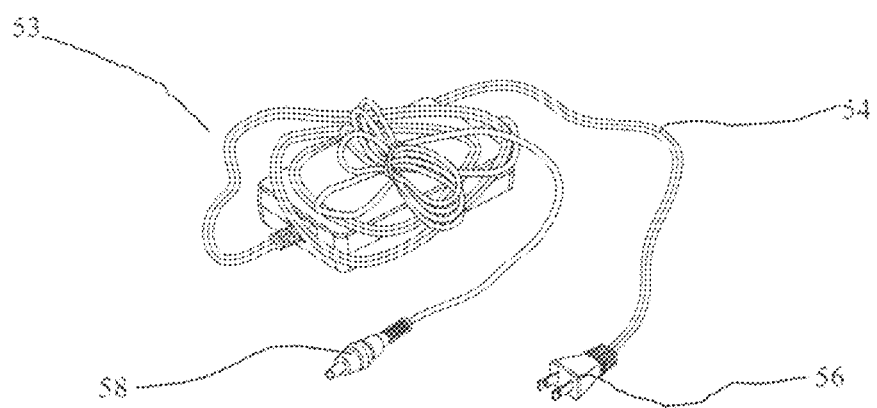
FIG. 3 is top perspective view of the AC/DC adapter for use in recharging the power source of the invention.
Figure 4:
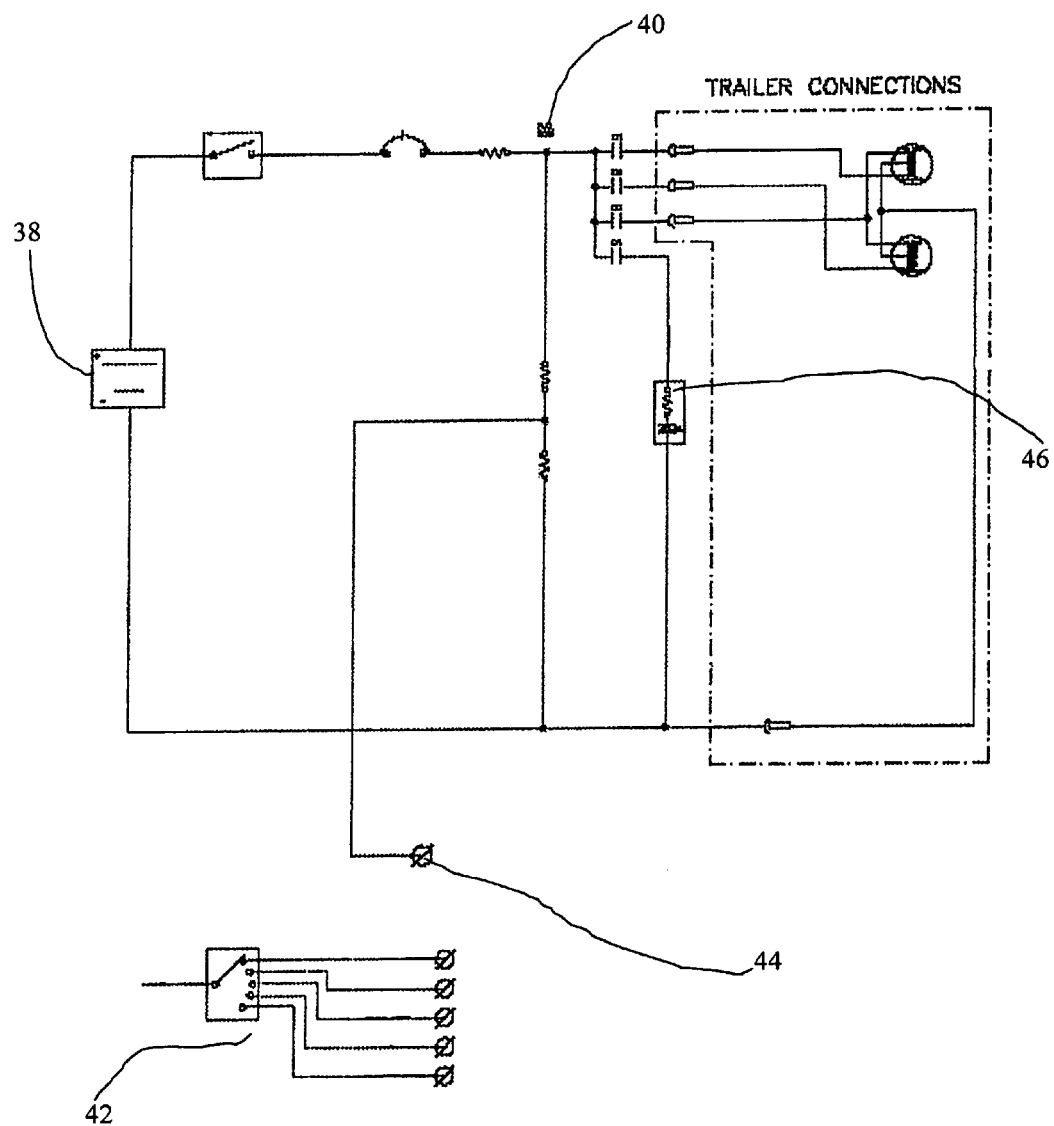
FIG. 4 is a wiring schematic of one embodiment of the operational and diagnostic means of the device.

FIG. 4 illustrates a schematic diagram of the preferred electrical circuitry employed in the light testing device. As depicted in FIG. 4, within the compact portable housing 10 is a self-contained rechargeable 12 volt power source 38 of sufficient capacity to power all functionality over a sustained period of time. The power source 38 is actuated by means of the on/off switch 16. On the top side 14 of the housing 10 is a power source recharge inlet 52 which enables the recharging of the power source 38 without removing the housing top side 14. Referring to FIG. 3, to recharge the power source 38, an AC/DC adapter 53 is utilized which includes an electrical cord 54 that has an electrical plug 56 that can be inserted into an outlet socket to receive AC and a connector plug 58 that can be inserted into the recharge inlet 52. Once connected, the AC/DC charge delivers a 12 volt charge to the power source 38.

In an alternative embodiment of the present invention, the power source is an external battery pack (not shown) adapted for being connected to the housing 10. The battery pack may be a rechargeable high power battery pack, such as a Li-ion pack comprised of one or a plurality of cells, for example. Those skilled in the art will understand that several of the components are conventional in nature and thus a detailed explanation is omitted for purposes of brevity.

Also within the compact portable housing 10 is a light mode control means 40 that enables the device to actuate a single light mode or to cycle automatically through multiple light modes at a predetermined time interval. The light mode control means 40 consists of a microcontroller or a programmable logic circuit 42. The light mode microcontroller 42 is programmed to activate the left turn signal, the right turn signal, the brake lights, the tail lights or a cycle. The light mode microcontroller 42 can also be programmed to test for the functioning of electric trailer braking systems and/or reverse indicator lights.

The compact portable housing 10 further contains an fault detection logic means 44 which identifies and indicates the existence of a fault, the location of the fault and what type of fault is detected, if any. The fault detection logic means 44 consists of a microcontroller or a programmable logic circuit 46 which microcontroller is programmed to activate the main fault indicator light 30 and location fault indicator lights for the left side 32, the right side 34 and the tail lights 36.

On the first side 48 of the compact portable housing 10, as shown in FIGS. 1 and 2, is a trailer light connection port 50 compatible for directly connecting with the trailer light wiring harness (not shown).

All wiring (not shown) for connecting the power source 38, light mode microcontroller 42, fault detection microcontroller 46, connection port 50, on/off switch means 16, fault indicator lights 30, 32, 34, 36, recharge inlet 52 and light mode selector button 18 and lights 20, 22, 24, 26 are maintained within the housing 10.

To operate the invention, the user plugs the trail light wiring harness (not shown) into the trailer light connection port 50. The user next moves the on/off switch 16 to the "on" position, thereby enabling the power source 38. The user presses light mode selector button 18 until the desired mode is illuminated; left turn signal 20, right turn signal 22, brake lights 24, tail lights 26 or cycle mode 28. The light mode selector button 18 directs power to the selected lights on the trailer. The user can then visually observe the functioning of the trailer lights. If a fault is present in the trailer lights, the fault detection logic means 44 determines the type and location of the error and sends power to the appropriate error detection indicator or indicators 32, 34, 36. Once the user has checked the trailer lights, the on/off switch 16 is moved to the "off" position. While the light testing device is not in use, the power source 38 may be fully recharged by simply engaging the

| Index of Elements for Trailer Light Tester | |
|---|---|
| 10 | Compact Portable Housing |
| 12 | Fixedly Attached Handle |
| 14 | Removably Attached Housing Top |
| 16 | On/Off Switch Means |
| 18 | Light Mode Selector Button |
| 20 | Left Turn Light Mode |
| 22 | Right Turn Light Mode |
| 24 | Brake Light Mode |
| 26 | Tail Light Mode |
| 28 | Cycle Mode |
| 30 | Main Fault Indicator Light |
| 32 | Left Side Fault Indicator Light |
| 34 | Right Side Fault Indicator Light |
| 36 | Tail Light Fault Indicator Light |
| 38 | Power Source |
| 40 | Light Mode Control Means |
| 42 | Light Mode Microcontroller |
| 44 | Fault Detection Logic Means |
| 46 | Fault Detection Microcontroller |
| 48 | Housing First Side |
| 50 | Trailer Light Connection Port |
| 52 | Power Source Recharge Inlet |
| 53 | AC/DC Adapter |
| 54 | Electrical Cord |
| 56 | Electrical Plug |
| 58 | Connector Plug |

What is claimed is:

1. A device for testing the functionality of a trailer lighting system comprising:
    a compact portable housing having a removable top side and a handle;
    a connection port operable to receive the trailer lighting system Wiring harness of recreational vehicles;
    a self-contained rechargeable 12 volt power source of sufficient capacity to power all functionality over a sustained period of time;
    an on/off switch means for connecting or disconnecting the power source;
    a power source recharge inlet which enables the recharging of the power source;
    a manually actuated light mode selector button to select from four individual light modes, defined as left turn signal, right turn signal, brake lights, and tail lights, and a cycle mode defined by an automated rotation through at least two of the individual light modes individually at a predetermined time interval;
    a light mode control means comprising at least one of a microcontroller and a programmable logic circuit which is programmed to actuate multiple light modes, including individual light modes and the cycle light mode based upon the mode specified by the user through the light mode selector, wherein said light mode control means actuates the brake lights mode by simultaneously actuating the left turn signal and the right turn signal modes;
    a main fault indicator light;
    location fault indicator lights for the left side, the right side and the tail lights; and
    a fault detection logic means comprising at least one of a microcontroller and a programmable logic circuit which is programmed to activate the main fault indicator light and location fault indicator lights for the left side, the right side and the tail lights.

2. A device for testing the functionality of a trailer lighting system comprising a fault detection logic means which identifies the existence of a fault, the location of the fault and the type of fault and indicates identified faults solely through left side, right side and tail light location fault indicator lights.

3. A device for testing the functionality of a trailer lighting system comprising a light mode control means which is configured to enable the device to actuate discrete left turn signal, right turn signal, brake lights, and tail lights light modes individually, wherein said light mode control means actuates the brake lights mode by simultaneously actuating the left turn signal and the right turn signal modes, and automatically cycle through multiple light modes at a predetermined time interval in response to a cycle mode user selection.

4. A self-contained device for testing the functionality of a trailer lighting system comprising:
    a fault detection logic means which identifies the existence of a fault, the location of the fault and the type of fault and indicates identified faults solely through left side, right side and tail light location fault indicator lights;
    a light mode control means which enables the user to manually or automatically cycle through multiple light modes;
    a rechargeable power source of sufficient capacity to power all functionality over a sustained period of time to eliminate the need for the presence of a towing vehicle or external power source; and
    a connection port operable to receive a trailer lighting system wiring harness.

5. The invention of claim 1 wherein the power source recharge inlet is conveniently located on the top side of the housing.

6. The invention of claim 1 wherein to recharge the self-contained rechargeable 12 volt power source an AC/DC adapter is utilized which includes an electrical cord that has an electrical plug that can be inserted into an outlet socket to receive AC and a connector plug that can be inserted into the recharge inlet.

7. The invention of claim 1 wherein the light mode selector button is conveniently located on the top side of the housing.

8. The invention of claim 1 wherein the main fault indicator light is conveniently located on the top side of the housing.

9. The invention of claim 1 wherein the location fault indicator lights are conveniently located on the top side of the housing.

10. The invention of claim 1 wherein all wiring for connecting the power source, light mode microcontroller, fault detection microcontroller, connection port, on/off switch means, fault indicator lights, recharge inlet, and light mode selector button and lights are maintained within the housing.

11. A self-contained portable device for testing the functionality of a trailer lighting system comprising:

a connection port for receiving a trailer lighting system wiring harness;

an internal rechargeable power source;

a manually actuated light mode selector button;

a light mode control means for enabling the device to actuate a left turn signal, right turn signal, brake lights, and tail lights light mode individually, wherein said light mode control means actuates the brake lights mode by simultaneously actuating the left turn signal and the right turn signal modes, or to cycle automatically through the multiple light modes at a predetermined time interval;

a main fault indicator light;

location fault indicator lights; and a fault detection logic means for identifying and indicating the existence of a fault, the location of the fault, and what type of fault is detected, if any.

12. The invention of claim 11 wherein the power source is a self-contained rechargeable 12 volt power source of sufficient capacity to power all functionality over a sustained period of time.

13. The invention of claim 11 wherein the manually actuated light mode selector button is used to select from light modes: left turn signal, right turn signal, brake lights, and tail lights, as well as a cycle mode which automatically rotates through the turn signals, brake lights and tail lights at a predetermined time interval.

14. The invention of claim 11 wherein the light mode control means is defined by a microcontroller programmed to actuate the left turn signal, the right turn signal, the brake lights, and the tail lights individually, and to cycle automatically through at least two of the left turn signal, the right turn signal, the brake lights, and the tail lights at a predetermined time interval based upon the mode specified by the user through the light mode selector.

15. The invention of claim 11 wherein the location fault indicator lights include indicator lights for the left side, the right side and the tail lights.

16. The invention of claim 11 wherein the fault detection logic means is defined by a microcontroller is programmed to activate the main fault indicator light and location fault indicator lights for the left side, the right side and the tail lights upon a fault being discovered within the trailer lighting system.

17. The invention of claim 11 wherein to recharge the self contained power source an AC/DC adapter is utilized which includes an electrical cord that has an electrical plug that can be inserted into an outlet socket to receive AC and a connector plug that can be inserted into the recharge inlet.

18. A device for testing the functionality of a trailer lighting system comprising:

a light mode control means comprising a microcontroller which is programmed to actuate discrete lights, including the left turn signal, the right turn signal, the brake lights, the tail lights, and to cycle automatically through at least two of said discrete lights by actuating them at a predetermined time interval based upon a user specified the mode to test the functionality of each trailer light;

a fault detection logic means comprising a microcontroller which is programmed to activate a main fault indicator light and one of three location fault indicator lights for the left side, the right side and the tail lights upon a fault being discovered within the trailing lighting system;

a power source; and a connection port for receiving a trailer lighting system wiring harness.

* * * * *